United States Patent
Kashiwaya et al.

(10) Patent No.: US 7,737,611 B2
(45) Date of Patent: Jun. 15, 2010

(54) PIEZOELECTRIC/ELECTROSTRICTIVE CERAMICS AND PIEZOELECTRIC/ELECTROSTRICTIVE DEVICE

(75) Inventors: Toshikatsu Kashiwaya, Inazawa (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/492,409

(22) Filed: Jun. 26, 2009

(65) Prior Publication Data

US 2009/0267446 A1    Oct. 29, 2009

Related U.S. Application Data

(63) Continuation of application No. PCT/JP2008/071697, filed on Nov. 28, 2008.

(30) Foreign Application Priority Data

Nov. 30, 2007    (JP)    ............................. 2007-310999

(51) Int. Cl.
    *H01L 41/187*    (2006.01)
(52) U.S. Cl. ..................................................... 310/358
(58) Field of Classification Search ................. 310/358, 310/311; 252/62.9 PZ, 62.9 R; 428/332; *H01L 41/187, H01L 41/083*
    See application file for complete search history.

(56) References Cited

U.S. PATENT DOCUMENTS

| | | | | |
|---|---|---|---|---|
| 5,169,551 A | * | 12/1992 | Tsunooka et al. | ....... 252/62.9 R |
| 5,607,614 A | * | 3/1997 | Kawano et al. | ....... 252/62.9 PZ |
| 5,994,822 A | | 11/1999 | Kondo et al. | |
| 2005/0153827 A1 | | 7/2005 | Kashiwaya et al. | |

FOREIGN PATENT DOCUMENTS

| JP | 49-032599 B1 | 8/1974 |
|---|---|---|
| JP | 54-029718 B1 | 9/1979 |
| JP | S54-029718 | 9/1979 |
| JP | 10-335713 A1 | 12/1998 |
| JP | 2005-170693 A1 | 6/2005 |
| JP | 2007-329414 A1 | 12/2007 |

* cited by examiner

*Primary Examiner*—Walter Benson
*Assistant Examiner*—Karen B Addison
(74) *Attorney, Agent, or Firm*—Burr & Brown

(57) ABSTRACT

The piezoelectric/electrostrictive properties and mechanical durability of a piezoelectric/electrostrictive ceramic can be improved. A piezoelectric/electrostrictive device has a laminated structure in which an electrode film, a piezoelectric/electrostrictive film, an electrode film, an piezoelectric/electrostrictive film, and an electrode film are laminated in the order mentioned on a thin portion of a substrate. The piezoelectric/electrostrictive films are ceramic films with a matrix of perovskite oxide that contains lead (Pb) as an A-site component and nickel (Ni), aluminum (Al), niobium (Nb), zirconium (Zr), and titanium (Ti) as B-site components. The piezoelectric/electrostrictive films are formed by firing as a unit the substrate that contains aluminum oxide and an intermediate coating film of perovskite oxide that contains components other than aluminum so that aluminum oxide is diffused from the substrate to the intermediate coating film.

15 Claims, 5 Drawing Sheets

PIEZOELECTRIC/ELECTROSTRICTIVE CERAMICS AND PIEZOELECTRIC/ELECTROSTRICTIVE DEVICE

TECHNICAL FIELD

The present invention relates to piezoelectric/electrostrictive ceramics having excellent piezoelectric/electrostrictive properties and high mechanical durability, and a piezoelectric/electrostrictive device using such piezoelectric/electrostrictive ceramics.

BACKGROUND ART

Lead nickel niobate ($Pb(Ni_{1/3}Nb_{2/3})O_3$)-lead zirconate ($PbZrO_3$)-lead titanate ($PbTiO_3$) (hereinafter referred to as "PNN-based") ternary piezoelectric/electrostrictive ceramics have high electric-field induced strains and, thus, are preferably used in actuators.

Further, as disclosed in Patent Document 1, adding aluminum oxide ($Al_2O_3$) to such PNN-based piezoelectric/electrostrictive ceramics has also been considered for the purpose of improving sintering properties, piezoelectric/electrostrictive properties, and the like.

Patent Document 1: Japanese Patent Publication No. 54-29718

DISCLOSURE OF INVENTION

Problems to be Solved by the Invention

However, such piezoelectric/electrostrictive ceramics as described in Patent Document 1 contain excessive amounts of nickel (Ni), aluminum (Al), niobium (Nb), zirconium (Zr), and titanium (Ti) that constitute the B site of the perovskite oxide, as compared to lead (Pb) that constitutes the A site, thus having the problem of being liable to form heterogeneous phases of aluminum oxide, nickel spinel ($NiAl_2O_4$), or any other aluminum compound. Such formation of heterogeneous phases may inhibit formation of domains that traverse crystal grains or may pin the movement of domain walls, thereby impairing the piezoelectric/electrostrictive properties of such piezoelectric/electrostrictive ceramics. In addition, such heterogeneous phases cannot follow a change in volume that occurs when the piezoelectric/electrostrictive ceramics produce a piezoelectric or inverse piezoelectric effect, so that they can be the starting points for cracks, lowering the mechanical durability of such piezoelectric/electrostrictive ceramics.

The present invention has been made in order to solve the above problems and has an object of improving the piezoelectric/electrostrictive properties and mechanical durability of a piezoelectric/electrostrictive body.

Means for Solving the Problems

To solve the above problems, the piezoelectric/electrostrictive ceramic according to a first aspect of the present invention is a piezoelectric/electrostrictive ceramic with a matrix of perovskite oxide that contains lead as an A-site component and nickel, aluminum, niobium, zirconium, and titanium as B-site components, wherein the perovskite oxide is synthesized by a step (a) of synthesizing an intermediate that contains components other than aluminum and a step (b) of solid-solving aluminum oxide in the intermediate.

A piezoelectric/electrostrictive ceramic according to a second aspect of the present invention is the piezoelectric/electrostrictive ceramic according to the first aspect of the invention, wherein in the step (b), aluminum oxide is solid-solved in the intermediate under a condition that an atmosphere control material composed of perovskite oxide that contains lead and nickel and a reactant that causes solid-phase dissolution of aluminum oxide in the intermediate coexist within a sheath.

A piezoelectric/electrostrictive ceramic according to a third aspect of the present invention is the piezoelectric/electrostrictive ceramic according to the second aspect of the invention, wherein the atmosphere control material has the same composition as the intermediate.

A piezoelectric/electrostrictive ceramic according to a fourth aspect of the present invention is the piezoelectric/electrostrictive ceramic according to either the second or the third aspect of the invention, wherein aluminum oxide is solid-solved in the intermediate under a condition that the atmosphere control material and the reactant coexist within the sheath, the atmosphere control material having a ratio M/V of its weight M to an internal volume V of the sheath between 0.5 g/l and 10 g/l.

A piezoelectric/electrostrictive ceramic according to a fifth aspect of the present invention is the piezoelectric/electrostrictive ceramic according to any one of the first to fourth aspects of the invention, wherein the step (a) is to synthesize the intermediate that contains an excessive amount of the A-site component as compared to the B-site components other than aluminum.

A piezoelectric/electrostrictive ceramic according to a sixth aspect of the present invention is the piezoelectric/electrostrictive ceramic according to any one of the first to fifth aspects of the invention, wherein the perovskite oxide has a composition represented by the general formula, $Pb_A\{(Ni_{1/3}Nb_{2/3})_w(Al_{1/2}Nb_{1/2})_xTi_yZr_z\}O_3$, where $w+x+y+z=1$.

A piezoelectric/electrostrictive ceramic according to a seventh aspect of the present invention is the piezoelectric/electrostrictive ceramic according to the first to sixth aspects of the invention, wherein the amount of a heterogeneous phase of an aluminum compound is 0.1% or less by volume.

A piezoelectric/electrostrictive device according to an eighth aspect of the present invention is a piezoelectric/electrostrictive device that comprises a piezoelectric/electrostrictive film of a piezoelectric/electrostrictive ceramic with a matrix of perovskite oxide that contains lead as an A-site component and nickel, aluminum, niobium, zirconium, and titanium as B-site components, electrode films that face each other sandwiching the piezoelectric/electrostrictive film therebetween, and a substrate that supports the piezoelectric/electrostrictive film and the electrode films, wherein the perovskite oxide is synthesized by a step (a) of synthesizing an intermediate that contains a component other than aluminum and a step (b) of solid-solving aluminum oxide in the intermediate.

A piezoelectric/electrostrictive device according to a ninth aspect of the present invention is the piezoelectric/electrostrictive device according to the eight aspect of the invention, wherein in the step (b), aluminum oxide is solid-solved in the intermediate under a condition that an atmosphere control material composed of perovskite oxide that contains lead and nickel and a reactant that causes solid-phase dissolution of aluminum oxide in the intermediate coexist within a sheath.

A piezoelectric/electrostrictive device according to a tenth aspect of the present invention is the piezoelectric/electrostrictive device according to the ninth aspect of the invention, wherein the atmosphere control material has the same composition as the intermediate.

A piezoelectric/electrostrictive device according to an eleventh aspect of the present invention is the piezoelectric/electrostrictive device according to either the ninth or the tenth aspect of the invention, wherein in the step (b), aluminum oxide is solid-solved in the intermediate under a condition that the atmosphere control material and the reactant coexist within the sheath, the atmosphere control material having a ratio M/V of its weight M to an internal volume V of the sheath between 0.5 g/l and 10 g/l.

A piezoelectric/electrostrictive device according to a twelfth aspect of the present invention is the piezoelectric/electrostrictive device according to any one of the eighth to eleventh aspects of the invention, wherein the substrate contains aluminum oxide, a film of the intermediate is formed on the substrate, and the substrate and the film of the intermediate are integrally fired, so that aluminum oxide is diffused from the substrate to the film of the intermediate and thereby solid-solved in the intermediate.

A piezoelectric/electrostrictive device according to a thirteenth aspect of the present invention is the piezoelectric/electrostrictive device according to any one of the eighth to twelfth aspects of the invention, wherein a film of the intermediate is formed on the substrate with a layer that is composed primarily of aluminum oxide sandwiched therebetween, and the substrate, the layer that is composed primarily of aluminum oxide, and the film of the intermediate are integrally fired, so that aluminum oxide is diffused from the layer that is composed primarily of aluminum oxide to the film of the intermediate and thereby solid-solved in the intermediate.

EFFECT OF THE INVENTION

The present invention reduces heterogeneous phases of an aluminum compound, thereby improving the piezoelectric/electrostrictive properties and mechanical durability of a piezoelectric/electrostrictive ceramic.

In particular, the twelfth and thirteenth aspects of the present invention allow a reduction in grain size, thereby improving the insulating properties of the piezoelectric/electrostrictive ceramic.

These and other objects, features, aspects and advantages of the present invention will become more apparent from the following detailed description of the present invention when taken in conjunction with the accompanying drawings.

BEST MODE FOR CARRYING OUT THE INVENTION

1. First Preferred Embodiment 1-1. Structure of Piezoelectric/Electrostrictive device 1

Figure 1:
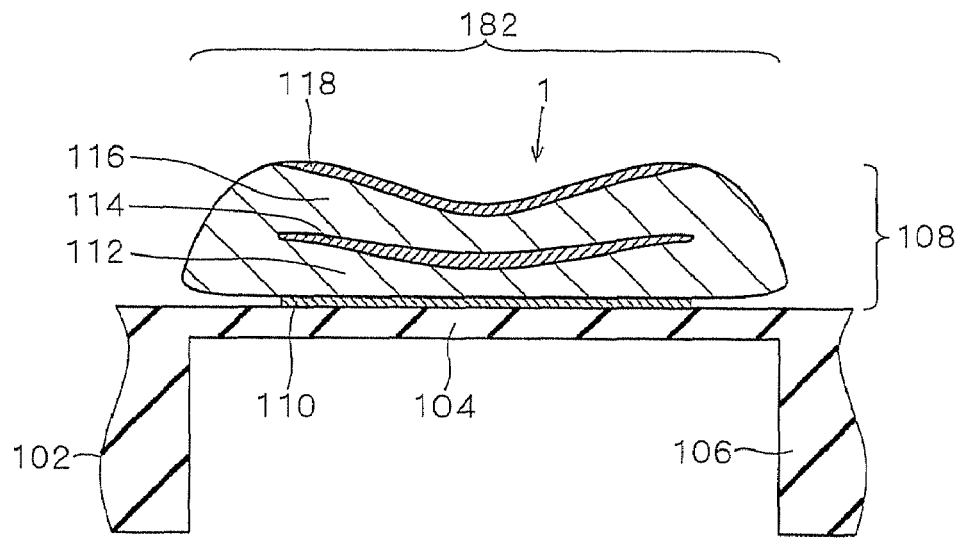
FIG. 1 is a cross-sectional view of a piezoelectric/electrostrictive device according to a first preferred embodiment.

FIG. 1 is a schematic diagram of a principal part of a piezoelectric/electrostrictive device 1 according to a first preferred embodiment of the present invention. The piezoelectric/electrostrictive device 1 is shown in cross section in FIG. 1. The piezoelectric/electrostrictive device 1 in FIG. 1 is an actuator adopted in an inkjet printer head. This is, however, not meant to limit the application of the present invention to only such piezoelectric/electrostrictive devices adopted in inkjet printer heads. For example, the present invention is also applicable to various kinds of actuators or sensors.

As illustrated in FIG. 1, the piezoelectric/electrostrictive device 1 has a laminated structure in which an electrode film 110, a piezoelectric/electrostrictive film 112, an electrode film 114, an piezoelectric/electrostrictive film 116, and an electrode film 118 are laminated in the order mentioned on a thin portion 104 of a substrate 102.

While FIG. 1 illustrates the case where a laminated body 108 that is formed by laminating the electrode film 110, the piezoelectric/electrostrictive film 112, the electrode film 114, the piezoelectric/electrostrictive film 116, and the electrode film 118 on the substrate 102 contains only a single layer of electrode film 114 therein, the present invention is also applicable to cases where the laminated body 108 contains two or more layers of electrode film therein or where the laminated body 108 contains no electrode film therein. Also, although in the case of FIG. 1, the laminated body 108 is formed directly on the substrate 102, the laminated body 108 may be formed indirectly on the substrate 102 with an inert layer provided therebetween. As another alternative, a plurality of piezoelectric/electrostrictive devices 1 may be arranged at regular intervals, forming an integral unit.

In the piezoelectric/electrostrictive device 1, a drive signal is applied between the electrode films 110, 118 that form external electrodes and the electrode film 114 that forms an internal electrode, whereby an electric field is applied to the piezoelectric/electrostrictive films 112 and 116, inducing flexural oscillations of the thin portion 104 and the laminated body 108. Hereinafter, a region 182 where such flexural oscillations are excited is referred to as a "flexural oscillation region."

1-2. Substrate 102

The substrate 102 supports the laminated body 108. The substrate 102 is a ceramic obtained by firing a lamination of sheet-like ceramic powder compacts.

The substrate 102 is composed of an insulating material. As an insulating material, it is preferable to adopt zirconium oxide ($ZrO_2$) with added calcium oxide (CaO), magnesium oxide (MgO), yttrium oxide ($Y_2O_3$), ytterbium oxide ($Yb_2O_3$), cerium oxide ($Ce_2O_3$), or any other stabilizer, that is, either stabilized or partially stabilized zirconia. The substrate 102 also contains aluminum oxide ($Al_2O_3$).

The substrate 102 has a cavity structure where the central thin portion 104 is surrounded and supported by a peripheral thick portion 106. By adopting such a cavity structure so that the thin portion 104 having a small plate thickness is supported by the thick portion 106 having a large plate thickness, the plate thickness of the thin portion 104 can be reduced while the mechanical strength of the substrate 102 is maintained. This reduces the stiffness of the thin portion 104 and increases the amount of displacement of the piezoelectric/electrostrictive device 1. The thin portion 104 preferably has a plate thickness between 0.5 and 15 µm, and more preferably, between 0.5 and 10 µm. This is because any plate thickness below this range tends to cause damage to the thin portion 104, whereas any plate thickness above this range tends to reduce the amount of displacement of the piezoelectric/electrostrictive device 1.

1-3. Piezoelectric/Electrostrictive Films 112 and 116

The piezoelectric/electrostrictive films 112 and 116 are ceramic that is formed by firing a film-like ceramic powder compact.

The piezoelectric/electrostrictive films 112 and 116 are composed of a piezoelectric/electrostrictive material. It is preferred that the piezoelectric/electrostrictive films 112 and 116 have a matrix of perovskite oxide that contains lead (Pb) as an A-site component and nickel (Ni), aluminum (Al), niobium (Nb), zirconium (Zr), and titanium (Ti) as B-site components. In particular, it preferably has a matrix of quaternary perovskite oxide, namely, lead nickel niobate ($Pb(Ni_{1/3}Nb_{2/3})O_3$)-lead aluminum niobate ($Pb(Al_{1/2}Nb_{1/2})O_3$)-lead zirconate ($PbZrO_3$)-lead titanate ($PbTiO_3$) perovskite oxide, and more preferably a matrix of perovskite oxide that has a composition represented by the general formula: $Pb_A\{(Ni_{1/3}Nb_{2/3})_w(Al_{1/2}Nb_{1/2})_x Ti_y Zr_z\}O_3$, where $w+x+y+z=1$. It is preferred that the amounts of components w, x, y, and z in lead nickel niobate, in lead aluminum niobate, in lead zirconate, and in lead titanate are fixed so that the perovskite oxide has a composition near the Morphotropic phase boundary, and they are also preferably fixed within the range of $0.08 \leq w \leq 0.43$, $0.01 \leq x \leq 0.08$, $0.10 \leq y \leq 0.80$, and $0.10 \leq z \leq 0.80$. It is preferred that the molar ratio (A) of an A-site component to a B-site component is fixed within the range of $0.9 \leq A \leq 1.1$.

It is preferred that heterogeneous phases of an aluminum compound such as aluminum oxide, nickel spinel ($NiAl_2O_4$), or the like contained in the piezoelectric/electrostrictive films 112 and 116 is reduced; the amount of heterogeneous phases of an aluminum compound is preferably 0.1% or less by volume, and more preferably, 0.05% or less by volume. Such a reduction of heterogeneous phases of an aluminum compound can lead to an improvement in the piezoelectric/electrostrictive properties, typified by electric-field induced strains, and in the mechanical durability of the piezoelectric/electrostrictive films 112 and 116.

In order to improve piezoelectric/electrostrictive properties, at least one or more oxides selected from the group consisting of yttrium oxide and cerium oxide may be solid-solved in the perovskite oxide, or the piezoelectric/electrostrictive films 112 and 116 may include at least one or more oxides selected from the group consisting of yttrium oxide, cerium oxide, and niobium oxide ($Nb_2O_5$).

As illustrated in FIG. 1, the piezoelectric/electrostrictive films 112 and 116 have such a film thickness distribution that the film thickness increases continuously from a central portion of the flexural oscillation region 182, the central portion being the antinode of the primary flexural mode, toward edge portions of the flexural oscillation region 182, the edge portions being the nodes of the primary flexural mode. By adopting such a film thickness distribution, electrical breakdown can be prevented because of the increased thickness of the piezoelectric/electrostrictive films 112 and 116 at the edge portions of the electrode films 110, 114, and 118, and the stiffness of the piezoelectric/electrostrictive films 112 and 116 can be reduced because of the reduced thicknesses of the piezoelectric/electrostrictive films 112 and 116 at the antinode of the primary flexural mode, which thereby increases the amount of displacement of the piezoelectric/electrostrictive device 1.

It is preferred that the piezoelectric/electrostrictive ceramic constituting the piezoelectric/electrostrictive films 112 and 116 has a small grain size; the grain size obtained by measuring electron micrographs of mirror polished faces of the piezoelectric/electrostrictive films 112 and 116 by the intercept method is preferably 6 µm or less, and more preferably, 4 µm or less. In this way, by reducing the grain size, a grain boundary that forms a current path can be lengthened, which improves the insulating properties of the piezoelectric/electrostrictive films 112 and 116. However, a tendency towards impaired piezoelectric/electrostrictive properties becomes apparent when the grain size becomes extremely small, so that the grain size is preferably 1 µm or higher, and more preferably, 1.5 µm or higher.

Figure 2:
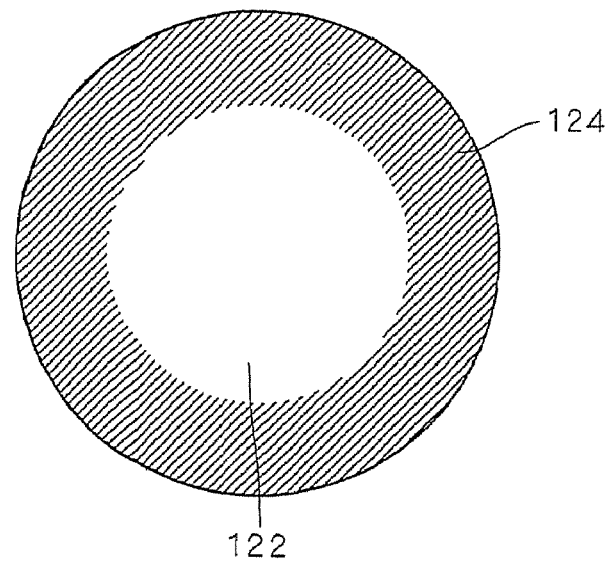
FIG. 2 is a schematic diagram of a microstructure of a crystal grain.

It is preferred, as illustrated in the schematic diagram of FIG. 2, that each crystal grain of the piezoelectric/electrostrictive films 112 and 116 has a core/shell structure in which a core portion 122 has a low concentration of aluminum and a high concentration of nickel and a shell portion 124 has a higher concentration of aluminum and a low concentration of nickel.

Such a core/shell structure can improve piezoelectric properties in the core portion and can improve insulating properties in the shell portion.

1-4. Electrode Films 110, 114, 118

The electrode films 110, 114, and 118 are composed of a conductive material. As a conductive material constituting the electrode films 110 and 114, it is preferable to adopt platinum (Pt), palladium (Pd), or an alloy composed primarily of Pt or Pd. However, if co-sintering with the piezoelectric/electrostrictive films 112 and 116 is possible, the electrode films 110 and 114 may be composed of any other conductive material. As a conductive material composing the electrode film 118, it is preferable to adopt gold (Au) or an alloy composed primarily of Au.

As illustrated in FIG. 1, the electrode films 110 and 114 face each other, sandwiching the piezoelectric/electrostrictive film 112 therebetween, and the electrode films 114 and 118 face each other, sandwiching the piezoelectric/electrostrictive film 116 therebetween. Also, the electrode films 110 and 118 are electrically connected to each other. With such a configuration, the piezoelectric/electrostrictive films 112 and 116 can expand and contract with the application of a drive signal between the electrode films 110, 118 that form the external films and the electrode film 114 that forms the internal electrode, which allows flexural oscillations of the flexural oscillation region 182.

1-5. Method of Producing Piezoelectric/Electrostrictive Device 1

Figure 3:
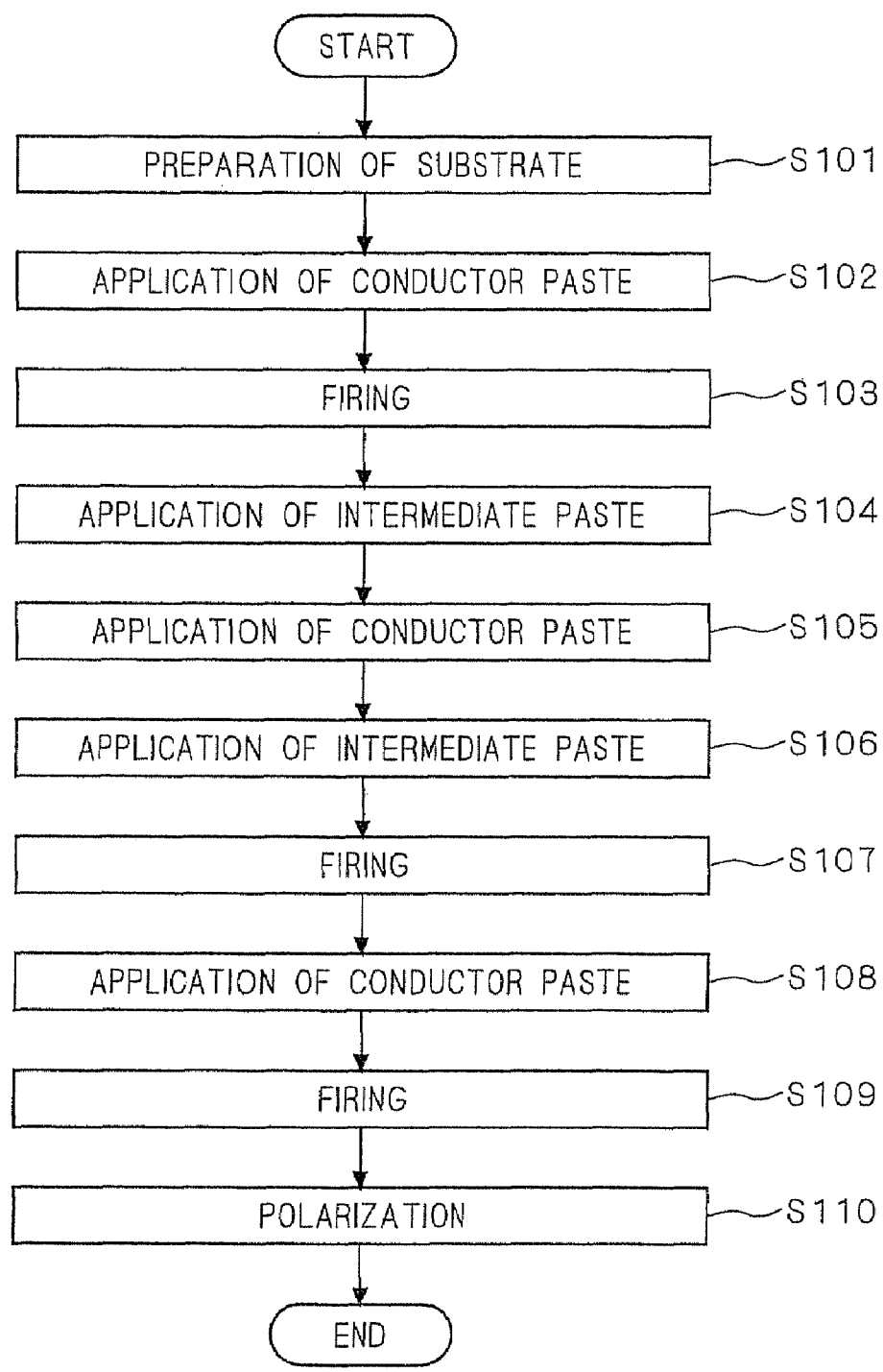
FIG. 3 is a flowchart for explaining a method of producing a piezoelectric/electrostrictive device according to the first preferred embodiment.

FIG. 3 is a flowchart explaining a method of producing the piezoelectric/electrostrictive device 1.

As illustrated in FIG. 3, for the production of the piezoelectric/electrostrictive device 1, the substrate 102 is first prepared (in step S101).

Then, the laminated body 108 is formed on the thin portion 104 of the substrate 102 (in steps S102~S109).

For the formation of the laminated body 108, a conductor paste obtained by kneading a conductive material powder, an organic solvent, a dispersant, and a binder is first applied to the upper surface of the thin portion 104 by screen printing (in step S102), and then, a resulting coating film is fired integrally with the substrate 102 (in step S103). This produces the electrode film 110 that is united with the substrate 102.

Then, an intermediate paste, a conductor paste, and again an intermediate paste are applied sequentially to the upper surface of the electrode film 110 by screen printing (in steps S104, S105, and S106), and a resulting coating film, the substrate 102, and the electrode film 110 are integrally fired (in step S107). This produces the piezoelectric/electrostrictive film 112, the electrode film 114, and the piezoelectric/electrostrictive film 116 that are united with the substrate 102 and the electrode film 110.

An intermediate paste is prepared by kneading a powder of an intermediate of perovskite oxide that contains components other than aluminum, an organic solvent, a dispersant, and a binder. With use of such an intermediate paste, an intermediate coating film is formed on the substrate 102 (in steps S104 and S106); when such an intermediate coating film is integrally fired with the substrate 102 that contains aluminum oxide (in step S107), aluminum oxide is diffused from the substrate 102 to the intermediate coating film and solid-solved in the intermediate, thereby producing the intended piezoelectric/electrostrictive films 112 and 116 with a matrix of perovskite oxide. At this time, since nickel that would constitute nickel spinel with aluminum is already one of components of the intermediate of a perovskite compound, it is unlikely that nickel oxide and aluminum oxide will directly react with each other, thereby generating nickel spinel. When an intended perovskite compound is synthesized in this way by solid-solving aluminum oxide in the intermediate, a ceramic consisting of crystal grains, each having the above-described core/shell structure, can be obtained.

The firing in step S107 is performed with the unfinished workpiece obtained by the end of step S106 being held within a ceramic container or sheath. At this time, it is preferable that the sheath contains therein both the unfinished workpiece that will be a reactant causing the solid-phase dissolution of aluminum oxide in the intermediate and an atmosphere control material that controls the firing atmosphere. This is because such coexistence of the unfinished workpiece and the atmosphere control material within a sheath can increase the amount of displacement in the piezoelectric/electrostrictive device 1. It is preferred that the atmosphere control material is a perovskite oxide that contains lead and nickel, and more preferably, a material that has the same composition as the intermediate. The ratio M/V of the weight M of the atmosphere control material to the internal volume V of the sheath during firing is preferably between 0.5 g/l and 10 g/l, more preferably between 0.8 g/l and 8 g/l, and still more preferably between 1.5 g/l and 6 g/l.

In the case of using a method of diffusing aluminum oxide from the substrate 102 to the piezoelectric/electrostrictive films 112 and 116, the laminated body 108 preferably has a maximum film thickness of 30 μm or less, more preferably 25 μm or less, and still more preferably 20 μm or less. This is because if the laminated body 108 has a maximum film thickness above this range, it would be difficult to diffuse aluminum oxide throughout the piezoelectric/electrostrictive films 112 and 116.

At this time, if yttrium oxide or cerium oxide is added to a conductor paste, such yttrium or cerium oxide will be diffused from a conductor coating film to an intermediate coating film at the time of firing the conductor coating film and the intermediate coating film as a unit, which results in the introduction of yttrium or cerium oxide in the piezoelectric/electrostrictive films 112 and 116. This is, however, not meant to limit the previous addition of yttrium or cerium oxide to the intermediate.

Thereafter, a conductor paste is applied to the upper surface of the piezoelectric/electrostrictive film 116 by screen printing (in step S108), and a resultant coating film is integrally fired with the substrate 102, the electrode film 110, the piezoelectric/electrostrictive film 112, the electrode film 114, and the piezoelectric/electrostrictive film 116 (in step S109). This produces the electrode film 118 that is united with the substrate 102, the electrode film 110, the piezoelectric/electrostrictive film 112, the electrode film 114, and the piezoelectric/electrostrictive film 116.

As a last step, polarization is performed by applying a voltage between the electrode films 110, 118 and the electrode film 114 (in step S110), which produces the piezoelectric/electrostrictive device 1.

1-6. Method of Synthesizing Intermediate Powder

Figure 4:
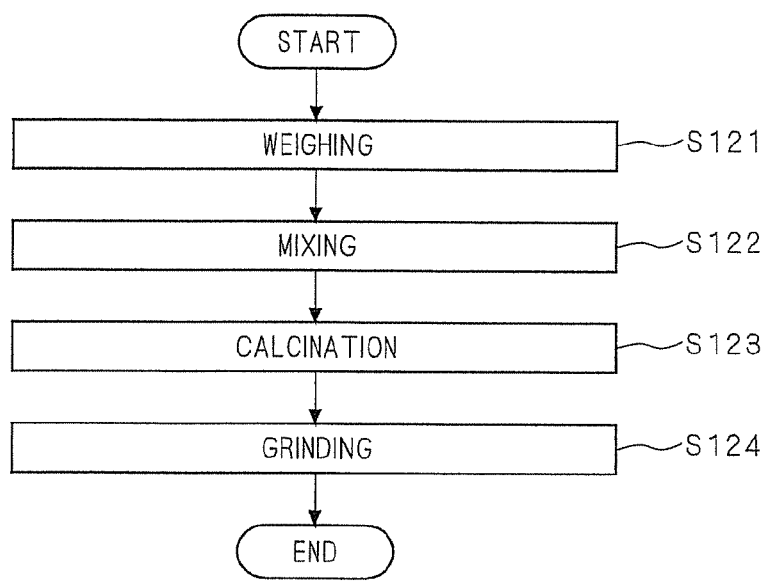
FIG. 4 is a flowchart for explaining a method of synthesizing an intermediate powder.

FIG. 4 is a flowchart explaining a method of synthesizing an intermediate powder.

As illustrated in FIG. 4, the synthesis of an intermediate powder starts first with the weighing of raw material powders of A-site components and B-site components, other than aluminum, of an intended perovskite oxide (in step S121). It is preferred that the raw materials are oxides, but they may alternatively be compounds, such as hydroxides, carbonates, tartrates, or the like, that turn into oxides at the time of calcination. For this weighing, it is preferred that an intermediate contains excessive amounts of A-site components as compared to B-site components other than aluminum, and when the piezoelectric/electrostrictive films 112 and 116 are formed by firing, such an excess of A-site components is resolved by solid-phase dissolution of aluminum oxide so as to obtain a stoichiometric composition. This accelerates the solid-phase dissolution of aluminum oxide and reduces heterogeneous phases of an aluminum compound, thereby improving the piezoelectric/electrostrictive properties and the mechanical durability of the piezoelectric/electrostrictive films 112 and 116.

The weighed raw materials are then mixed together with a dispersion medium in a ball mill or the like, and the dispersion medium is removed from a slurry of the mixed raw materials by a method such as evaporation drying or filtration (in step S122).

Subsequently, the mixed raw materials are calcined so that the raw materials react with each other (in step S123).

As a last step, the calcined materials are ground with a dispersion medium in a ball mill or the like, and the dispersion medium is removed from a slurry of the calcined and ground materials by a method such as evaporation drying or filtration (in step S124). This produces an intermediate powder.

It is noted herein that, because of the possible evaporation of lead and nickel during firing, the obtained composition may not be the one intended. Thus, it is also preferable that, for the synthesis of an intermediate powder, the amounts of lead and nickel may be increased in consideration of the amount of possible evaporation thereof. In this way, increasing the amount of nickel also brings about the effect of accelerating grain growth during firing.

2. Second Preferred Embodiment

Figure 5:
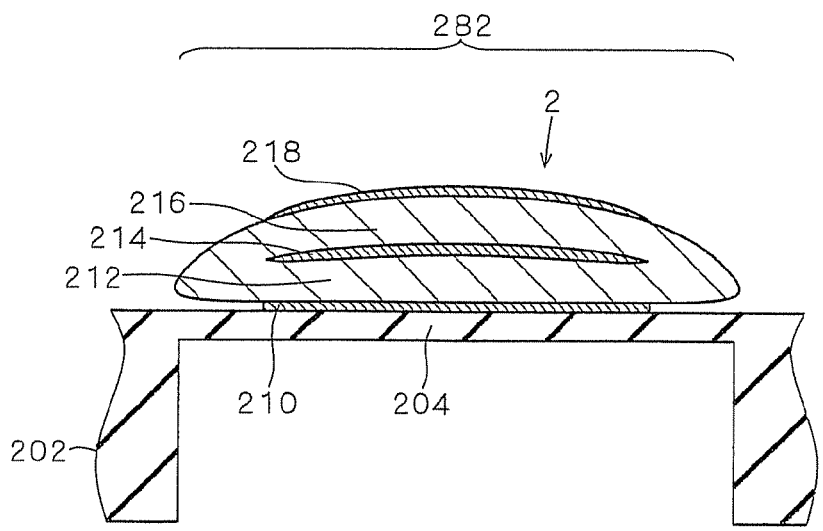
FIG. 5 is a cross-sectional view of a piezoelectric/electrostrictive device according to a second preferred embodiment.

FIG. 5 is a schematic diagram of a principal part of a piezoelectric/electrostrictive device 2 according a second preferred embodiment of the present invention. The piezoelectric/electrostrictive device 2 is shown in cross section in FIG. 5. Like the piezoelectric/electrostrictive device 1 according to the first preferred embodiment, the piezoelectric/electrostrictive device 2 in FIG. 5 is an actuator adopted in an inkjet printer head.

As illustrated in FIG. 5, the piezoelectric/electrostrictive device 2, like the piezoelectric/electrostrictive device 1, has a laminated structure where an electrode film 210, a piezoelectric/electrostrictive film 212, an electrode film 214, an piezoelectric/electrostrictive film 216, and an electrode film 218 are laminated in the order mentioned on a thin portion 204 of a substrate 202. The substrate 202, the electrode film 210, the piezoelectric/electrostrictive film 212, the electrode film 214, the piezoelectric/electrostrictive film 216, and the electrode film 218 of the piezoelectric/electrostrictive device 2 are configured in the same manner as the substrate 102, the electrode film 110, the piezoelectric/electrostrictive film 112, the electrode film 114, the piezoelectric/electrostrictive film 116, and the electrode film 118 of the piezoelectric/electrostrictive device 1, respectively, except in that the piezoelectric/electrostrictive films 212 and 216 have a different film thickness distribution from the piezoelectric/electrostrictive films 112 and 116.

The piezoelectric/electrostrictive films 212 and 216 have such a film thickness distribution that the film thickness decreases continuously from the central portion of a flexural oscillation region 282, the central portion being the antinode of the primary flexural mode, toward the edge portions of the flexural oscillation region 282, the edge portions being the nodes of the primary flexural mode. This distribution is the opposite of that of the piezoelectric/electrostrictive films 112 and 116.

It is preferable also in this piezoelectric/electrostrictive device 2 that the piezoelectric/electrostrictive films 212 and 216 are produced by forming, on the substrate 202, an intermediate coating film of perovskite oxide that contains components other than aluminum and then firing the intermediate coating film with the substrate 202 that contains aluminum oxide as a unit.

3. Third Preferred Embodiment

3-1. Structure of Piezoelectric/Electrostrictive Device 3

Figure 6:
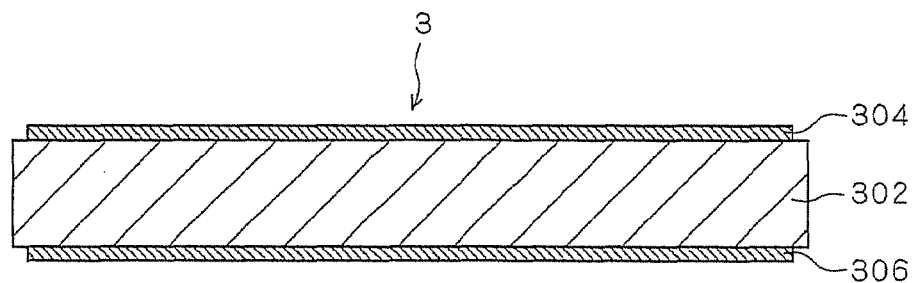
FIG. 6 is a cross-sectional view of a piezoelectric/electrostrictive device according to a third preferred embodiment.

FIG. 6 is a schematic diagram of a principal part of a piezoelectric/electrostrictive device 3 according to a third preferred embodiment of the present invention. The piezoelectric/electrostrictive device 3 is shown in cross section in FIG. 6. The piezoelectric/electrostrictive device 3 in FIG. 6 is an actuator.

As illustrated in FIG. 6, the piezoelectric/electrostrictive device 3 has a structure where electrode films 304 and 306 are formed on both major surfaces of a piezoelectric/electrostrictive body plate 302.

In the piezoelectric/electrostrictive device 3, an electric field is applied to the piezoelectric/electrostrictive body plate 302 by applying a drive signal between the electrode films 304 and 306, thereby inducing extensional oscillations of the piezoelectric/electrostrictive body plate 302.

3-2. Piezoelectric/Electrostrictive Plate 302

The piezoelectric/electrostrictive plate 302 is a ceramic that is produced by firing a plate-like ceramic powder compact.

The piezoelectric/electrostrictive plate 302 is composed of a piezoelectric/electrostrictive material. It is preferred that the piezoelectric/electrostrictive plate 302 has a matrix of perovskite oxide that contains lead as an A-site component and nickel, aluminum, niobium, zirconium, and titanium as B-site components. In particular, it preferably has a matrix of quaternary perovskite oxide, namely, lead nickel niobate-lead aluminum niobate-lead zirconate-lead titanate perovskite oxide, and more preferably a matrix of perovskite oxide, that has a composition represented by the general formula: $Pb_A\{(Ni_{1/3}Nb_{2/3})_w(Al_{1/2}Nb_{1/2})_xTi_yZr_z\}O_3$, where $w+x+y+z=1$. It is preferred that the amounts of components w, x, y, and z in lead nickel niobate, in lead aluminum niobate, in lead zirconate, and in lead titanate are fixed so that the perovskite oxide has a composition near the Morphotropic phase boundary, and they are also preferably fixed within the range of $0.08 \leq w \leq 0.43$, $0.01 \leq x \leq 0.08$, $0.10 \leq y \leq 0.80$, and $0.10 \leq z \leq 0.80$. The molar ratio (A) of the A-site component to the B-site component is preferably fixed within the range of $0.9 \leq A \leq 1.1$.

It is preferred that heterogeneous phases of an aluminum compound such as aluminum oxide, nickel spinel, or the like contained in the piezoelectric/electrostrictive plate 302 is reduced; the amount of heterogeneous phases of an aluminum compound is preferably 0.1% or less by volume, and more preferably, 0.05% or less by volume. Such a reduction of heterogeneous phases of an aluminum compound can lead to an improvement in the piezoelectric/electrostrictive properties, typified by electric-field induced strains, and in the mechanical durability of the piezoelectric/electrostrictive plate 302.

3-3. Electrode Films 304 and 306

The electrode films 304 and 306 are composed of a conductive material. As a conductive material, it is preferable to adopt silver (Ag) or an alloy composed primarily of Ag.

As illustrated in FIG. 6, the electrode films 304 and 306 face each other, sandwiching the piezoelectric/electrostrictive body plate 302 therebetween. With such a configuration, the piezoelectric/electrostrictive body plate 302 can expand and contract with the application of a drive signal between the electrode films 304 and 306.

3-4. Method of Producing Piezoelectric/Electrostrictive Device 3

Figure 7:
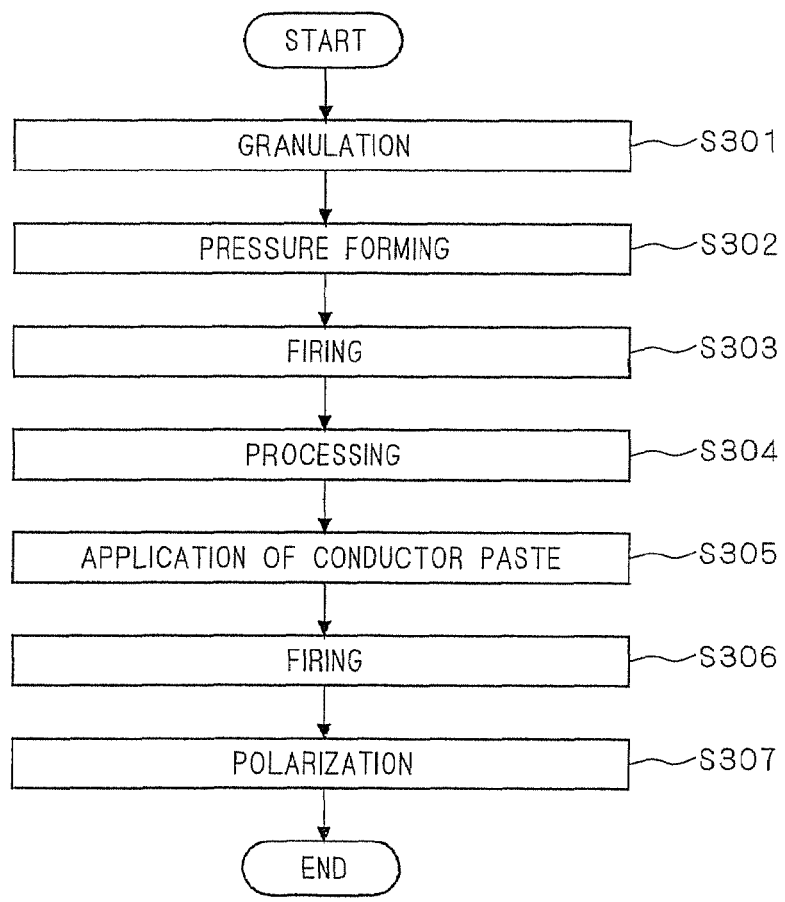
FIG. 7 is a flowchart for explaining a method of producing a piezoelectric/electrostrictive device according to the third preferred embodiment.

FIG. 7 is a flowchart explaining a method of producing the piezoelectric/electrostrictive device 3.

As illustrated in FIG. 7, the production of the piezoelectric/electrostrictive device 3 starts first with granulation of a perovskite oxide powder by mixing a perovskite oxide powder with a dispersion medium and a binder, using a mixer or the like, and then drying the resultant slurry with a spray drier or the like (in step S301).

Then, the granulated perovskite oxide powder is formed into a plate shape by pressure (in step S302). Alternatively, a perovskite oxide powder may be mixed with a dispersion medium and a binder in a ball mill or the like, and the resultant slurry may be slip-casted or tape-casted and laminated into a plate shape.

Following this, the resultant compact is fired (in step S303).

The firing in step S303 is performed with the unfinished workpiece (compact) obtained by the process to step S302 being held within a ceramic container or sheath. At this time, it is desirable that the sheath contains therein both the unfinished workpiece that will be a reactant for the reaction of solid-phase dissolution of aluminum oxide in the intermediate and an atmosphere control material that controls the firing atmosphere. This is because such coexistence of the unfinished workpiece and the atmosphere control material within a sheath can increase the amount of displacement of the piezoelectric/electrostrictive device 3. It is preferred that the atmosphere control material is a perovskite oxide that contains lead and nickel, and more preferably, a material that has the same composition as the intermediate. The ratio M/V of the weight M of the atmosphere control material to the internal volume V of the sheath during firing is preferably between 0.5 g/l and 10 g/l, more preferably, between 0.8 g/l and 8 g/l, and still more preferably, between 1.5 g/l and 6 g/l.

The obtained sintered body is then processed into a final shape by polishing with a lapping machine or the like and by cutting with a dicing saw or the like (in step S304). This produces the piezoelectric/electrostrictive body plate 302.

Then, a conductor paste obtained by kneading a conductor powder, an organic solvent, and a glass frit is applied to both of the major surfaces of the piezoelectric/electrostrictive body plate 302 (in step S305), and the resultant coating film is fired on the piezoelectric/electrostrictive body plate 302 (in step S306). This produces the electrode films 304 and 306. Alternatively, the electrode films 304 and 306 may be produced by any other method such as evaporation or electroless plating.

As a last step, polarization is performed by applying a voltage between the electrode films 304 and 306 (in step S306), which produces the piezoelectric/electrostrictive device 3.

3-5. Synthesis of Perovskite Oxide Powder

Figure 8:
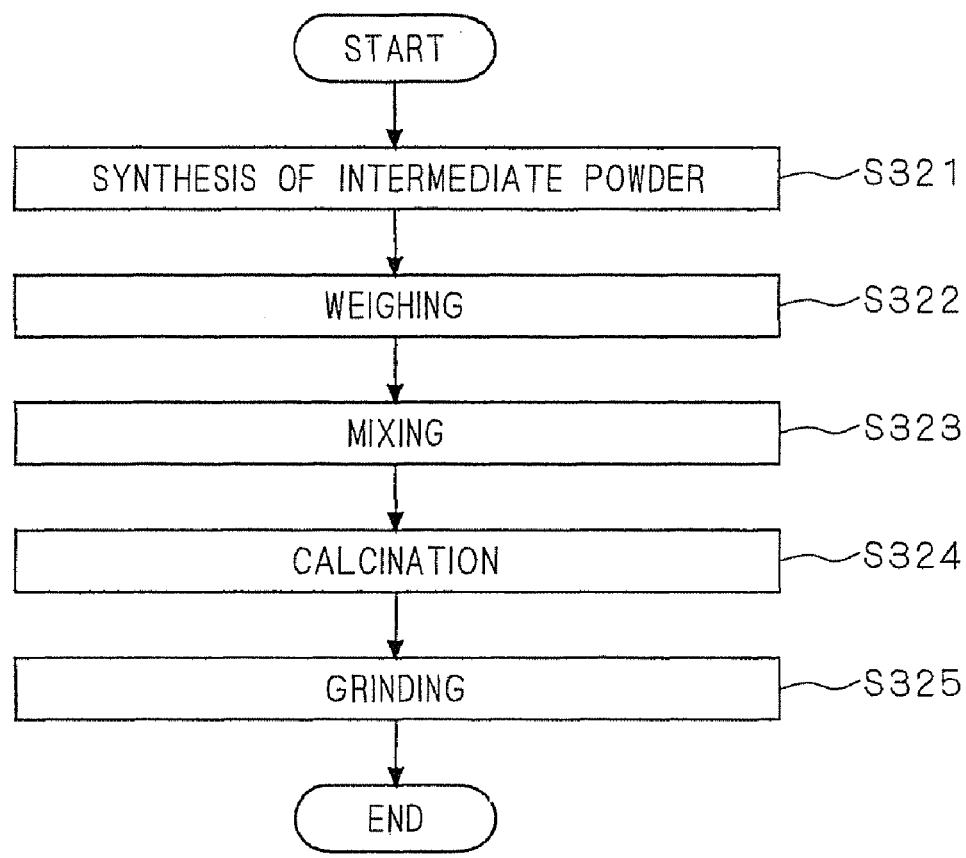
FIG. 8 is a flowchart for explaining a method of synthesizing a perovskite oxide powder.

FIG. 8 is a flowchart explaining a method of synthesizing a perovskite oxide powder.

As illustrated in FIG. 8, the synthesis of a perovskite oxide powder starts first with the synthesis of an intermediate powder through the same procedure as described in the first preferred embodiment (in step S321).

Then, the intermediate powder and a raw material powder for aluminum are weighed (in step S322). It is preferred that the raw material for aluminum is an oxide, but it may alternatively be a compound, such as hydroxides, carbonates, tartrates, or the like, that turns into an oxide at the time of calcination. For this weighing, it is preferred that an excess of A-site components is resolved by solid-phase dissolution of aluminum oxide so as to obtain a stoichiometric composition.

Then, the intermediate material and the raw material for aluminum that have been weighed are mixed together with a dispersion medium in a ball mill or the like, and the dispersion medium is removed from a slurry of the mixed intermediate and raw material for aluminum by a method such as evaporation drying or filtration (in step S323).

Subsequently, the mixed intermediate and the raw material for aluminum are calcined so that the intermediate and the raw material for aluminum react with each other (in step S324). This causes solid-phase dissolution of aluminum oxide in the intermediate, thereby producing an intended perovskite oxide. At this time, since the nickel that would constitute nickel spinel with aluminum is already one of the components of the intermediate of a perovskite compound, it is unlikely that nickel oxide and aluminum oxide will directly react with each other, thereby generating nickel spinel.

As a last step, the calcined materials are ground with a dispersion medium in a ball mill or the like, and the dispersion medium is removed from a slurry of the calcined and ground materials by a method such as evaporation drying or filtration (in step S325). This produces a perovskite oxide powder.

EXAMPLES

Now, Examples 1 and Examples 3 to 10 that are relevant to the first preferred embodiment, Example 2 that is relevant to the third preferred embodiment, and Comparative Examples 1 to 3 that are outside the scope of the present invention are described.

Example 1

In Example 1, raw materials other than aluminum oxide, namely, lead oxide (PbO), nickel oxide (NiO), niobium oxide ($Nb_2O_5$), zirconium oxide ($ZrO_2$), and titanium oxide ($TiO_2$), were weighed so as to obtain a composition represented by $0.22Pb(Ni_{1/3}Nb_{2/3})O_3$-$0.04Pb(Al_{1/2}Nb_{1/2})O_3$-$0.33PbZrO_3$-$0.41PbTiO_3$.

Then, the weighed raw materials were mixed with water as a dispersion medium in a ball mill, and a slurry of the mixed raw materials was dried by evaporation.

Following this, the mixed raw materials were packed in a sheath of magnesium oxide (MgO) and calcined in an electric furnace at 850° C. so that the raw materials reacted with each other.

Then, the calcined raw materials were ground with water as a dispersion medium in a ball mill, and a slurry of the calcined and ground raw materials was dried by evaporation to thereby obtain an intermediate powder.

After the synthesis of the intermediate powder, an intermediate paste was produced by kneading the intermediate powder, an organic solvent, a dispersant, and a binder.

On the other hand, aside from the production of the intermediate paste, a substrate 102 of stabilized zirconia that contained 0.3% by weight aluminum oxide and that was stabilized by yttrium oxide was prepared. The plane configuration of the thin portion 104 of the substrate 102 was a rectangle of 1.6 mm×1.1 mm. Also, the thin portion 104 had a plate thickness of 6 μm.

Then, a platinum paste obtained by kneading a platinum powder, an organic solvent, a dispersant, and a binder was applied to the flat upper surface of the thin portion 104 by screen printing, thereby producing a platinum-paste coating film. The plane configuration of the platinum-paste coating film was a rectangle of 1.3 mm×0.9 mm. Also, the platinum-paste coating film had a film thickness of 2 μm.

Following this, the platinum-paste coating film was held and fired in an electric furnace at 1300° C. for two hours.

Subsequently, the intermediate paste, the platinum paste, and again the intermediate paste were applied sequentially to the upper surface of the electrode film 110 so as to obtain an intermediate-paste coating film, a platinum-paste coating film, and again an intermediate-paste coating film. The plane configuration of the intermediate-paste coating films was a rectangle of 1.3 mm×0.9 mm. Also, the intermediate-paste coating films had a film thickness of 14 μm. The applied platinum paste contained 0.6 parts by weight of cerium oxide to 100 parts by weight of the platinum powder, and 20 parts by volume of the intermediate powder to 100 parts by volume of the platinum powder. The platinum-paste coating film had a film thickness of 2 μm.

Then, the intermediate-paste coating film, the platinum-paste coating film, and the intermediate-paste coating film were packed in a sheath of magnesium oxide and held and fired in an electric furnace at 1275° C. for two hours. The fired piezoelectric/electrostrictive films 112 and 116 had a film thickness of 10 μm.

Then, a gold paste obtained by kneading a gold powder, an organic solvent, a dispersant, and a binder was applied to the upper surface of the piezoelectric/electrostrictive film 112 by screen printing, thereby producing a gold-paste coating film. The plane configuration of the gold-paste coating film was a rectangle of 1.2 mm×0.8 mm. Also, the gold-paste coating film had a film thickness of 0.5 μm.

Then, the gold-paste coating film was held and fired in an electric furnace at 800° C. for two hours.

As a last step, polarization was performed with the application of an electric field of 4 kV/mm to the piezoelectric/electrostrictive films 112 and 116, thereby producing the piezoelectric/electrostrictive device 1.

When the piezoelectric/electrostrictive films 112 and 116 of the piezoelectric/electrostrictive device 1 produced as described above were measured for the amount of flexural displacement with the application of an electric field of 4 kV/mm, the value of 2.1 μm was obtained. Further, when the electrical resistance value was measured after a durability test in which an electric field of 4 kV/mm was applied to the piezoelectric/electrostrictive films 112 and 116 for 24 consecutive hours in an environment with a temperature of 80° C. and moisture of 80% RH, then the value of $5\times10^9\Omega$ was obtained. When a natural surface of the piezoelectric/electrostrictive film 116 prior to the formation of the electrode film 118 was observed under an electron microscope, it was found that the grain size was between 2 and 4 µm.

Comparative Example 1

In Comparative Example 1, a piezoelectric/electrostrictive device was produced in the same manner as described in Example 1, except for the use of a substrate that contained no aluminum oxide. Evaluation of such a piezoelectric/electrostrictive device in the same manner as described in Example 1 showed that the amount of flexural displacement was 1.8 µm, the electrical resistance value after durability testing was $7\times10^5\Omega$, and the grain size was between 5 and 8 µm.

Comparison between Example 1 and Comparative Example 1

As is clear from the comparison between Example 1 and Comparative Example 1, in the piezoelectric/electrostrictive device 1 with the piezoelectric/electrostrictive films 112 and 116 that are obtained by solid-phase dissolution of aluminum oxide in an intermediate of perovskite oxide that contains components other than aluminum, both the amount of flexural displacement and the electrical resistance value after durability testing can be improved, and also the piezoelectric/electrostrictive films 112 and 116 have a small grain size.

Example 2

In Example 2, an intermediate powder was first prepared in the same manner as described in Example 1.

Then, the intermediate powder and an aluminum oxide powder were weighed so as to obtain a composition represented by $0.22Pb(Ni_{1/3}Nb_{2/3})O_3$-$0.04Pb(Al_{1/2}Nb_{1/2})O_3$-$0.33PbZrO_3$-$0.41PbTiO_3$.

Following this, the weighed intermediate and aluminum oxide were mixed with water as a dispersion medium in a ball mill, and a slurry of the mixed intermediate and aluminum oxide was dried by evaporation.

Then, the mixed intermediate and aluminum oxide were packed in a sheath of magnesium oxide and calcined in an electric furnace at 850° C. so that the intermediate and aluminum oxide reacted with each other.

The calcined material was then ground with water as a dispersion medium in a ball mill, and a slurry of the calcined and ground material was dried by evaporation, thereby producing a perovskite oxide powder.

Following this, the perovskite oxide powder was mixed with a dispersion medium and a binder using a mixer, and the resultant slurry was dried with a spray drier so that the perovskite oxide powder was granulated.

The granulated perovskite oxide powder was then formed by pressure, producing a disc-shaped compact having a diameter of 20 mm and a plate thickness of 8 mm.

Then, the perovskite oxide compact was packed in a sheath of magnesium oxide and held and fired in an electric furnace at 1250° C. for three hours, thereby forming a sintered body.

Subsequently, the obtained sintered body was processed into a rectangular shape of 12 mm×3 mm×1 mm with a lapping machine and a dicing saw, and a silver paste was applied by screen printing to and fired on both major surfaces of the processed sintered body, which produced the electrode films 304 and 306.

As a last step, polarization was performed by immersing the piezoelectric/electrostrictive body plate 302 with the baked electrode films 304 and 306 in silicon oil at 75° C. and applying an electric field of 2 kV/mm for 15 minutes, thereby producing the piezoelectric/electrostrictive device 3.

A piezoelectric constant $d_{31}$ of the piezoelectric/electrostrictive body plate 302 measured after a lapse of 24 hours from polarization was −287 pm/V. The piezoelectric constant $d_{31}$ was obtained by first measuring the frequency-impedance characteristics and electrostatic capacitance of the piezoelectric/electrostrictive device 3 with an impedance analyzer as well as measuring the dimensions of the piezoelectric/electrostrictive device 3 with a micrometer, and then making a calculation from the resonance and anti-resonance frequencies of the fundamental wave of lengthwise extensional oscillations, the electrostatic capacitance, and the dimensions.

When a separately prepared specimen that had a plate thickness of 0.2 mm was measured for mechanical strength, using a four-point bending test, after a durability test was conducted in which a triangular-wave electric field of 0 to 2 kV/mm was applied $10^9$ times, the value of 53 MPa was obtained.

Furthermore, when the sintered body was mirror-polished and the microstructure of the ceramic was observed under an electron microscope, very few or no heterogeneous phases were observed inside the sintered body.

Comparative Example 2

In Comparative Example 2, a piezoelectric/electrostrictive device was produced through the same procedure as that in Example 2 and evaluated in the same manner as described in Example 2, using material powder synthesized by weighing, mixing, calcinating, and grinding powder of all raw materials, i.e., lead oxide, aluminum oxide, nickel oxide, niobium oxide, zirconium oxide, and titanium oxide so as to obtain a composition represented by: $0.22Pb(Ni_{1/3}Nb_{2/3})O_3$-$0.04Pb(Al_{1/2}Nb_{1/2})O_3$-$0.33PbZrO_3$-$0.41PbTiO_3$.

The result showed that the piezoelectric constant $d_{31}$ was −255 pm/V, the mechanical strength after durability testing was 38 MPa, and a number of heterogeneous phases were observed inside the sintered body. When the observed heterogeneous phases were further analyzed by EDS (Energy Dispersive X-ray Spectrometer) and XRD (X-ray Diffractometer), they were identified as nickel spinel.

Comparative Example 3

In Comparative Example 3, a piezoelectric/electrostrictive device was produced through the same procedure as that in Example 2 and evaluated in the same manner as described in Example 2, using material powder synthesized by weighing, mixing, calcinating, and grinding powder of all raw materials, i.e., lead oxide, nickel oxide, niobium oxide, zirconium oxide, titanium oxide, and aluminum oxide so as to obtain a composition represented by: $0.26Pb(Ni_{1/3}Nb_{2/3})O_3$-$0.33PbZrO_3$-$0.41PbTiO_3$ with the addition of 0.3% by weight $Al_2O_3$.

The result showed that the piezoelectric constant $d_{31}$ was −246 pm/V, the mechanical strength after durability testing was 42 MPa, and a number of heterogeneous phases were observed inside the sintered body. When the observed heterogeneous phases were further analyzed by EDS and XRD, they were identified as aluminum oxide and nickel spinel.

Comparison between Example 2 and Comparative Examples 2, 3

As is clear from a comparison between Example 2 and Comparative Examples 2 and 3, by first synthesizing an intermediate that contains excessive amounts of the A-site components as compared to the B-site components other than aluminum and then synthesizing an intended perovskite oxide by solid-phase dissolution of aluminum oxide in the intermediate, the segregation of an aluminum compound can be reduced and, thereby, the piezoelectric constant and the mechanical strength after durability testing can be improved.

Examples 3 to 10

In Examples 3 to 10, first of all, an intermediate powder, like the one in Example 1, was prepared.

Then, an electrode film 110 of platinum was formed on the upper surface of the thin portion 104 of the substrate 102 composed of stabilized zirconia that contained 0.3% by weight aluminum oxide and that was stabilized by yttrium oxide.

Following this, an intermediate paste, a platinum paste, and again an intermediate paste were applied sequentially over the electrode film 110.

Then, the unfinished workpiece was held in a sheath of magnesium oxide, and an intermediate-paste coating film, a platinum-paste coating film, and again an intermediate-paste coating film were held and fired in an electric furnace at 1275° C. for two hours. Such firing was performed under the condition that an atmosphere control material powder that had the same composition as the intermediate was held within the sheath, i.e., under the condition that the unfinished workpiece and the atmosphere control material coexisted within the sheath. The ratios M/V of the weight M of the atmosphere control material to the internal volume V of the sheath during firing were 0 g/l, 0.5 g/l, 0.8 g/l, 1.5 g/l, 3 g/l, 6 g/l, 8 g/l, and 10 g/l, respectively, in Examples 3 to 10.

When the piezoelectric/electrostrictive films 112 and 116 of those piezoelectric/electrostrictive devices 1 produced in this way in Examples 3 to 10 were measured for flexural displacement with the application of an electric field of 4 kV/mm, the values of 2.1 μm, 2.2 μm, 2.3 μm, 2.5 μm, 2.6 μm, 2.4 μm, 2.3 μm, and 2.1 μm were obtained, respectively. This showed that the coexistence of a proper amount of atmosphere control material and the unfinished workpiece during firing could improve flexural displacement.

Modifications

Although in the above-described first preferred embodiment, aluminum oxide is diffused from the substrate 102 to the intermediate film, the source of aluminum oxide (or the diffusion source) may be anything other than the substrate 102. For instance, aluminum oxide may be diffused from a conductor-paste coating film that is to be the electrode films 110 and 114, to the intermediate film. Also, the intermediate film may be formed on the substrate 102, with a layer that is composed primarily of aluminum oxide interposed therebetween. Then, the substrate, the layer composed primarily of aluminum oxide, and the intermediate film may be integrally fired so that aluminum oxide is diffused from the layer composed primarily of aluminum oxide to the intermediate film and thereby solid-solved in the intermediate. In this way, it there is any source of aluminum oxide other than the substrate 102, the substrate 102 does not necessarily contain aluminum oxide.

While the invention has been shown and described in detail, the foregoing description is in all aspects illustrative and not restrictive. It is therefore understood that numerous modifications and variations can be devised without departing from the scope of the invention. In particular, any combination of the techniques described in the first to third preferred embodiments would be naturally expected.

The invention claimed is:

1. A piezoelectric/electrostrictive ceramic with a matrix of perovskite oxide that contains lead as an A-site component and nickel, aluminum, niobium, zirconium, and titanium as B-site components, wherein said perovskite oxide is synthesized by the steps of:
   (a) synthesizing an intermediate that contains components other than aluminum, and
   (b) solid-solving aluminum oxide in said intermediate.

2. The piezoelectric/electrostrictive ceramic according to claim 1, wherein in said step (b), aluminum oxide is solid-solved in said intermediate under a condition that an atmosphere control material composed of a perovskite oxide that contains lead and nickel and a reactant that causes solid-phase dissolution of aluminum oxide in said intermediate coexist within a sheath.

3. The piezoelectric/electrostrictive ceramic according to claim 2, wherein said atmosphere control material has the same composition as said intermediate.

4. The piezoelectric/electrostrictive ceramic according to claim 3, wherein in said step (b), aluminum oxide is solid-solved in said intermediate under a condition that said atmosphere control material and said reactant coexist within said sheath, said atmosphere control material having a ratio M/V of its weight M to an internal volume V of said sheath between 0.5 g/l and 10 g/l.

5. The piezoelectric/electrostrictive ceramic according to claim 2, wherein in said step (b), aluminum oxide is solid-solved in said intermediate under a condition that said atmosphere control material and said reactant coexist within said sheath, said atmosphere control material having a ratio M/V of its weight M to an internal volume V of said sheath between 0.5 g/l and 10 g/l.

6. The piezoelectric/electrostrictive ceramic according to claim 1, wherein said step (a) is to synthesize said intermediate that contains an excessive amount of the A-site component as compared to the B-site components other than aluminum.

7. The piezoelectric/electrostrictive ceramic according to claim 1, wherein said perovskite oxide has a composition represented by a general formula, $Pb_A\{(Ni_{1/3}Nb_{2/3})_w(Al_{1/2}Nb_{1/2})_x Ti_y Zr_z\}O_3$, where $w+x+y+z=1$.

8. The piezoelectric/electrostrictive ceramic according to claim 1, wherein the amount of a heterogeneous phase of an aluminum compound is 0.1% or less by volume.

9. A piezoelectric/electrostrictive device comprising:
   a piezoelectric/electrostrictive film of a piezoelectric/electrostrictive ceramic with a matrix of perovskite oxide that contains lead as an A-site component and nickel, aluminum, niobium, zirconium, and titanium as B-site components;
   electrode films that face each other sandwiching said piezoelectric/electrostrictive film therebetween; and
   a substrate that supports said piezoelectric/electrostrictive film and said electrode films;
   wherein said perovskite oxide is synthesized by the steps of:
   (a) synthesizing an intermediate that contains a component other than aluminum, and
   (b) solid-solving aluminum oxide in said intermediate.

10. The piezoelectric/electrostrictive device according to claim 9, wherein in said step (b), aluminum oxide is solid-solved in said intermediate under a condition that an atmosphere control material composed of perovskite oxide that contains lead and nickel and a reactant that causes solid-phase dissolution of aluminum oxide in said intermediate coexist within a sheath.

11. The piezoelectric/electrostrictive device according to claim 10, wherein said atmosphere control material has the same composition as said intermediate.

12. The piezoelectric/electrostrictive device according to claim 11, wherein in said step (b), aluminum oxide is solid-solved in said intermediate under a condition that said atmosphere control material and said reactant coexist within said sheath, said atmosphere control material having a ratio M/V of its weight M to an internal volume V of said sheath between 0.5 g/l and 10 g/l.

13. The piezoelectric/electrostrictive device according to claim 10, wherein in said step (b), aluminum oxide is solid-solved in said intermediate under a condition that said atmosphere control material and said reactant coexist within said sheath, said atmosphere control material having a ratio M/V of its weight M to an internal volume V of said sheath between 0.5 g/l and 10 g/l.

14. The piezoelectric/electrostrictive device according to claim 9, wherein
   said substrate contains aluminum oxide; and
   a film is formed of said intermediate on said substrate, and said substrate and said film of intermediate are fired as a unit, so that aluminum oxide is diffused from said substrate to said film of intermediate and thereby solid-solved in said intermediate.

15. The piezoelectric/electrostrictive device according to claim 9, wherein a film is formed of said intermediate on said substrate with a layer that is composed primarily of aluminum oxide sandwiched therebetween, and said substrate, said layer that is composed primarily of aluminum oxide, and said film of intermediate are fired as a unit, so that aluminum oxide is diffused from said layer that is composed primarily of aluminum oxide to said film of intermediate and thereby solid-solved in said intermediate.

* * * * *